(12) United States Patent
Lee et al.

(10) Patent No.: US 12,451,064 B2
(45) Date of Patent: Oct. 21, 2025

(54) DISPLAY PANEL AND ELECTROLUMINESCENT DISPLAY DEVICE INCLUDING THE SAME AND PIXEL DRIVING CIRCUIT

(71) Applicant: LG Display Co., Ltd., Seoul (KR)

(72) Inventors: Booheung Lee, Gyeonggi-do (KR); SungHun Kim, Iksan-si (KR); DongHo Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 37 days.

(21) Appl. No.: 18/354,578

(22) Filed: Jul. 18, 2023

(65) Prior Publication Data

US 2024/0071307 A1   Feb. 29, 2024

(30) Foreign Application Priority Data

Aug. 30, 2022  (KR) ........................ 10-2022-0108878

(51) Int. Cl.
*G09G 3/3233*   (2016.01)
*G09G 3/3266*   (2016.01)
*G09G 3/3275*   (2016.01)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC .. G09G 3/3233; G09G 3/3266; G09G 3/3275; G09G 2310/0297; G09G 2320/0247; G09G 2330/021; G09G 2300/0426; G09G 2300/0819; G09G 2300/0852; G09G 2300/0861; G09G 3/38; G09G 2300/0842; G09G 2330/028; H01L 27/1225; H01L 29/78672; H01L 29/7869; H10K 59/1213; H10K 59/1216; H10K 59/131; H10K 59/35
See application file for complete search history.

(56) References Cited

U.S. PATENT DOCUMENTS

2015/0243220 A1\*   8/2015  Kim ................... H01L 27/0705
                                                 345/215
2015/0325197 A1\*  11/2015  Hong ................ G02F 1/136286
                                                 345/94
(Continued)

*Primary Examiner* — Antonio Xavier
(74) *Attorney, Agent, or Firm* — Fenwick & West LLP

(57) ABSTRACT

The disclosure provides a display panel configured to enhance image quality and an electroluminescent display device including the same, and a pixel driving circuit. An electroluminescent display device according to an embodiment of the disclosure comprises a plurality of pixels including at least two pixels and a common circuit disposed between the plurality of pixels. One of the plurality of pixels includes a driving transistor including a first node, a second node, and a third node, a capacitor connected to a fourth node electrically shared by the plurality of pixels and the second node, a second transistor connected with the first node and a data line, and a light emitting element electrically connected with the driving transistor. The common circuit includes a high-potential voltage providing circuit providing a high-potential voltage to the fourth node and a reference voltage providing circuit providing a reference voltage.

19 Claims, 12 Drawing Sheets

(52) U.S. Cl.
CPC ............... *G09G 2310/0297* (2013.01); *G09G 2320/0247* (2013.01); *G09G 2330/021* (2013.01)

(56) References Cited

U.S. PATENT DOCUMENTS

| | | | | |
|---|---|---|---|---|
| 2019/0130832 | A1* | 5/2019 | Chang | G09G 3/3266 |
| 2019/0130846 | A1* | 5/2019 | Chung | G09G 3/3233 |
| 2020/0203382 | A1* | 6/2020 | Jung | H01L 25/18 |
| 2020/0212161 | A1* | 7/2020 | Choi | H10K 50/828 |
| 2021/0134917 | A1* | 5/2021 | Li | H10F 30/222 |
| 2022/0358884 | A1* | 11/2022 | Chae | G09G 3/3233 |
| 2023/0005431 | A1* | 1/2023 | Choe | G09G 3/3275 |
| 2024/0054927 | A1* | 2/2024 | Park | G09G 3/006 |

\* cited by examiner

DISPLAY PANEL AND ELECTROLUMINESCENT DISPLAY DEVICE INCLUDING THE SAME AND PIXEL DRIVING CIRCUIT

CROSS-REFERENCE TO RELATED APPLICATION

This application claims priority from Republic of Korea Patent Application No. 10-2022-0108878, filed on Aug. 30, 2022, which is hereby incorporated by reference in its entirety.

BACKGROUND

Technical Field

The disclosure relates to a display panel capable of enhancing image quality, and an electroluminescent display device including the same, and a pixel driving circuit.

Description of Related Art

With the development of information technology, the market for display devices as a medium of connection between users and information is growing. As a result, the use of various types of display devices, such as electroluminescent display devices, liquid crystal display devices, organic light emitting display devices, and quantum dot display devices, is increasing.

Among them, electroluminescent display devices have the advantages of fast response time, high emission efficiency, and large viewing angle. An electroluminescent display device includes a display panel including a plurality of subpixels, a pixel driving circuit for supplying signals to drive the display panel, and a power supply for supplying power to the display panel. The pixel driving circuit includes a gate driving circuit that supplies gate signals to the display panel and a data driving circuit that supplies data signals to the display panel.

For example, an electroluminescent display device may display an image by causing light emitting elements of selected subpixels to emit light when a gate signal and a data signal are supplied to the subpixels. The light emitting element may be implemented based on an organic or inorganic material.

The electroluminescent display device displays images based on the light generated by the light emitting elements in subpixels, which provides various advantages. However, to enhance image quality, it is necessary to enhance the accuracy of the pixel driving circuit that controls the light emission of subpixels. For example, the accuracy of the pixel driving circuit may be enhanced by compensating for the threshold voltage of the driving transistors included in the pixel driving circuit.

Further, to reduce power consumption, the electroluminescent display device may be driven at low speeds, which may cause image quality degradation that is not recognized when driven at high speeds. Therefore, a need exists for a pixel driving circuit that may prevent degradation of image quality.

SUMMARY

As mentioned above, as the resolution and power consumption of electroluminescent display devices increase, driving techniques are being developed to reduce the power consumption of electroluminescent display devices. To reduce power consumption, pixels may be driven at a reduced frame rate for a specific period of time. For example, for mobile models, power consumption may be reduced by performing normal driving at a frequency of 60 Hz or 120 Hz in active mode and low-speed driving at a frequency of 1 Hz in standby mode.

Further, if the transistors included in the pixel driving circuit are implemented as P-type polycrystalline transistors, leakage current may occur at the gate node of the driving transistor upon low-speed driving. The occurrence of leakage current makes it difficult for the light emitting element to maintain the same luminance for one frame, and prolongs the data update cycle, which may cause the screen to flicker.

Further, as the vertical resolution of the display panel increases due to the larger size and higher resolution of the electroluminescent display device, the sampling time to compensate for the threshold voltage of the driving transistors becomes insufficient, making accurate subpixel grayscale representation difficult.

Further, the large size and high resolution of electroluminescent display devices reduce the width of the high-potential voltage line provided to the pixel driving circuit, resulting in increased resistance of the high-potential voltage line and a significant voltage drop.

Embodiments of the disclosure aim to provide a display panel free from flickering at low speed driving and an electroluminescent display device including the same.

Embodiments of the disclosure also aim to provide a display panel for accurate grayscale representation and an electroluminescent display device including the same.

Embodiments of the disclosure also aim to provide a display panel capable of compensating for a voltage drop in a high-potential voltage line and an electroluminescent display device including the same.

Objects of the disclosure are not limited to the foregoing, and other unmentioned objects would be apparent to one of ordinary skill in the art from the following description.

An electroluminescent display device according to an embodiment of the disclosure comprises a plurality of pixels including at least two pixels and a common circuit disposed between the plurality of pixels. Any one of the plurality of pixels includes a driving transistor including a first node, a second node, and a third node, a capacitor connected to a fourth node electrically shared by the plurality of pixels and the second node, a second transistor connected with the first node and a data line, and a light emitting element electrically connected with the driving transistor. The common circuit includes a high-potential voltage providing circuit providing a high-potential voltage to the fourth node and a reference voltage providing circuit providing a reference voltage. Accordingly, it is possible to prevent poor image quality of the electroluminescent display device during high-speed and low-speed driving.

A display panel according to another embodiment of the disclosure comprises a plurality of pixels and a unit pixel including the plurality of pixels. The unit pixel includes a first data line and a second data line included in each of the plurality of pixels, a first high-potential power line disposed between the first data line and the second data line, a first reset voltage line disposed on one side of the first data line or the second data line, and a reference voltage line parallel to the first reset voltage line, disposed on one side of the unit pixel, and electrically connected to a plurality of pixels included in the unit pixel. The reference voltage line is electrically connected to a plurality of pixels included in the unit pixel through a reference voltage providing circuit.

Thus, it is possible to enhance the image quality of the display panel by preventing a voltage drop in the high-potential power line through the reference voltage providing circuit although the high-potential power line whose width has been reduced is disposed in the pixel.

A pixel driving circuit according to a further embodiment of the disclosure is disposed in each of a plurality of pixels. The pixel driving circuit comprises: a driving transistor electrically connected with a light emitting element, and including a first node, a second node and a third node; a capacitor connected to a fourth node electrically shared by the plurality of pixels and the second node; a second transistor connected with the first node and a data line; and a common circuit disposed between the plurality of pixels. The common circuit includes a high-potential voltage providing circuit providing a high-potential voltage to the fourth node and a reference voltage providing circuit providing a reference voltage.

Specific details of other embodiments are included in the detailed description and drawings.

According to embodiments of the disclosure, neighboring pixels share a common circuit, and the common circuit is electrically connected to the neighboring pixels via a common node. In this case, the pixels may represent accurate grayscales by adopting a common circuit designed to be robust against the coupling phenomenon.

According to embodiments of the disclosure, it is possible to allow for high-speed driving and secure a sampling time by placing two data lines in a row of pixels and connecting even-numbered pixels and odd-numbered pixels to different data lines.

According to embodiments of the disclosure, it is possible to reduce the width of the high-potential voltage line by adopting a pixel driving circuit that provides driving current without a high-potential voltage element, and it is also possible to reduce the bezel area by placing low-potential voltage lines.

The foregoing description of the problems to be solved, the means of solving the problems, and the effects is not intended to specify any essential feature of the claims, and the scope of the claims is not limited by what is recited in the specification.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
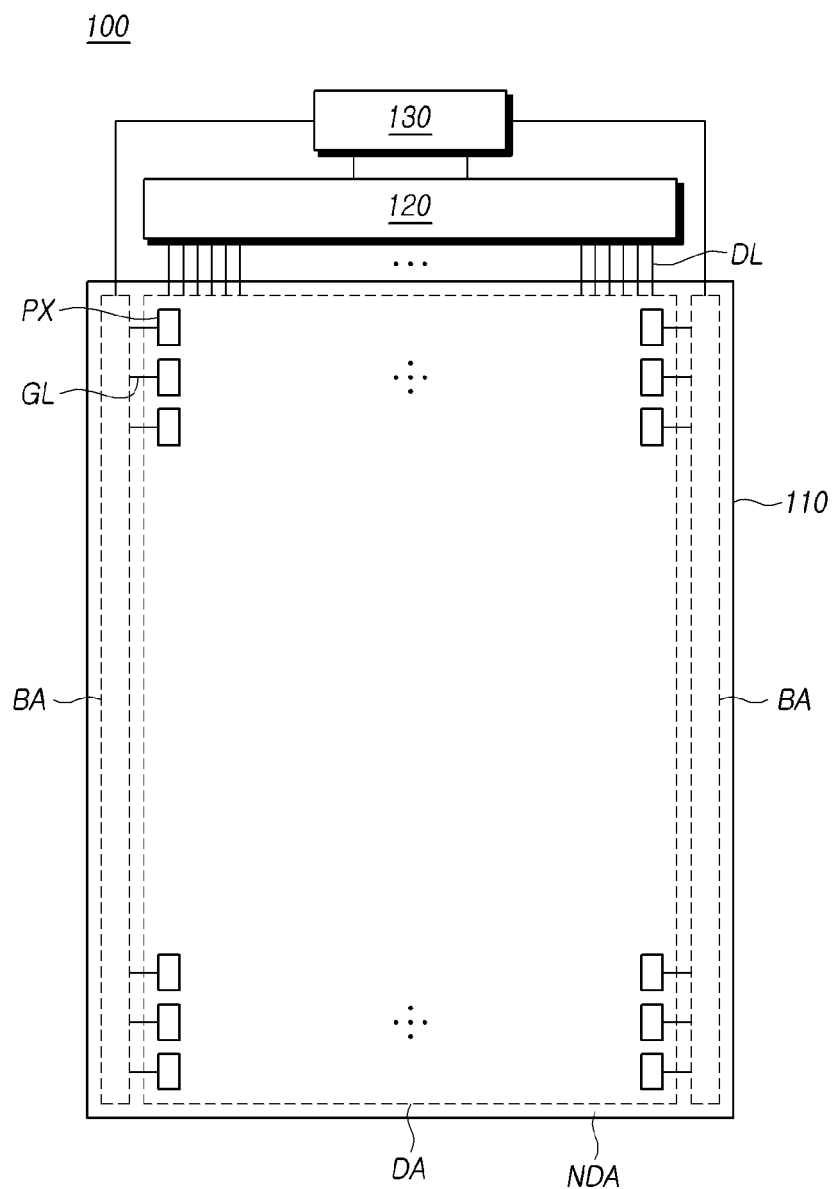
FIG. 1 is a block diagram illustrating an electroluminescent display device according to an embodiment of the disclosure.

Advantages and features of the disclosure, and methods for achieving the same may be understood through the embodiments to be described below taken in conjunction with the accompanying drawings. However, the disclosure is not limited to the embodiments disclosed herein, and various changes may be made thereto. The embodiments disclosed herein are provided only to inform one of ordinary skilled in the art of the category of the disclosure. The disclosure is defined only by the appended claims.

The shapes, sizes, proportions, angles, and numbers disclosed in the drawings to illustrate embodiments of the disclosure are exemplary and are not intended to limit the disclosure to those shown. When determined to make the subject matter of the disclosure unclear, the detailed description of the known art or functions may be skipped. As used herein, when a component "includes," "has," or "is composed of" another component, the component may add other components unless the component "only" includes, has, or is composed of the other component. As used herein, the singular forms "a," "an," and "the" are intended to include the plural forms as well, unless the context clearly indicates otherwise.

Components are interpreted to include a margin of error, even if not explicitly stated otherwise.

If the description is of a positional relationship, for example, "on", "above", "under", "below", "next to", etc. of two parts, one or more other parts may be located between the two parts, unless "directly" is used.

When such terms as, e.g., "after", "next to", and "before", are used to describe a temporal relationship, operation methods, and fabricating methods, it may include a non-continuous relationship unless the term "immediately" or "directly" is used.

The feature of various embodiments of the disclosure may be partially or wholly combined or coupled with each other, and various technical interlockings and operations are possible, and the embodiments may be practiced independently of each other or in conjunction with each other.

The pixel driving circuit formed on the substrate of the electroluminescent display device described herein may be implemented with N-type or P-type transistors. For example, the transistor may be implemented as a transistor having a metal oxide semiconductor field effect transistor (MOSFET) structure. The transistor is a three-electrode device that includes a gate electrode, a source electrode, and a drain electrode. The source and drain electrodes of the transistor may switch depending on the applied voltage, rather than fixed.

Hereinafter, a display panel and an electroluminescent display device including the same according to an embodiment of the disclosure are described with reference to the accompanying drawings.

FIG. 1 is a block diagram illustrating an electroluminescent display device according to an embodiment of the disclosure.

Referring to FIG. 1, an electroluminescent display device 100 according to an embodiment of the disclosure may include a display panel 110 on which a plurality of data lines DL and a plurality of gate lines GL are disposed and a plurality of pixels PX connected with the plurality of data lines DL and the plurality of gate lines GL are arranged, and driving circuits that provide driving signals to the display panel 110.

The plurality of pixels PX are illustrated as being arranged in a matrix form to form a pixel array but, without limitations thereto, may be arranged in other various forms.

The driving circuits may include a data driving circuit 120 that provides data signals to the plurality of data lines DL, a gate driving circuit that provides gate signals to the plurality of gate lines GL, and a controller 130 that controls the data driving circuit 120 and the gate driving circuit.

The display panel 110 may include a display area DA in which images are displayed and a non-display area NDA which is an area outside of the display area DA. A plurality of pixels PX, data lines DL providing data signals to the plurality of pixels PX, and gate lines GL providing gate signals may be disposed in the display area DA.

The plurality of data lines DL disposed in the display area DA may extend to the non-display area NDA to electrically connect with the data driving circuit 120. The data line DL electrically connects the plurality of pixels PX, disposed in the column direction, to the data driving circuit 120 and may be disposed to extend as a single line. Alternatively, the data line DL may be connected to the data driving circuit 120 by connecting with the link line via contact holes.

The plurality of gate lines GL disposed in the display area DA may extend to the non-display area NDA to electrically connect with the gate driving circuit. The gate line GL electrically connects the plurality of pixels PX, disposed in the row direction, to the gate driving circuit. Further, lines for the gate driving circuit to generate various gate signals or transfer signals to the plurality of pixels PX may be disposed in the non-display area NDA. For example, the lines may include one or more high-level gate voltage lines supplying a high-level gate voltage to the gate driving circuit, one or more low-level gate voltage lines supplying a low-level gate voltage to the gate driving circuit, a plurality of clock lines supplying a plurality of clock signals to the gate driving circuit, and one or more start lines supplying one or more start signals to the gate driving circuit.

On the display panel 110, the plurality of data lines DL and the plurality of gate lines GL are disposed with the pixel array. As described above, the plurality of data lines DL and the plurality of gate lines GL may be disposed in rows or columns, respectively. For convenience of description, it is described that the plurality of data lines DL are disposed in columns and the plurality of gate lines GL are disposed in rows, but the disclosure is not limited thereto.

The controller 130 starts data signal scanning according to the timings in each frame, converts image data input from the outside to fit into the data signal format used in the data driving circuit 120, outputs the converted image data, and controls the data driving circuit 120 at proper times according to scanning.

The controller 130 receives, from the outside, timing signals including a vertical synchronization signal, a horizontal synchronization signal, an input data enable signal, and a clock signal, along with the input image data. The controller 130 receiving the timing signals generates and outputs control signals for controlling the data driving circuit 120 and the gate driving circuit.

For example, to control the data driving circuit 120, the controller 130 outputs various data control signals including, e.g., a source start pulse, a source sampling clock, and a source output enable signal. The source start pulse controls the data sampling start timing of one or more data signal generating circuit constituting the data driving circuit 120. The source sampling clock is a clock signal for controlling the sampling timing of data in each data signal generating circuit. The source output enable signal controls the output timing of the data driving circuit 120.

Further, the controller 130 outputs gate control signals, including a gate start pulse, a gate shift clock, a gate output enable signal, and the like, to control the gate driving circuit. The gate start pulse controls the operation start timing of one or more gate signal generating circuits that constitute the gate driving circuit. The gate shift clock is a clock signal commonly input to one or more gate signal generating circuits, which controls the shift timing of the scan signal. The gate output enable signal designates timing information about one or more gate signal generating circuits.

The controller 130 may be a timing controller used in typical display technology, or a control device that may perform other control functions as well as the functions of the timing controller.

The controller 130 may be implemented as a separate component from the data driving circuit 120, or the controller 130, along with the data driving circuit 120, may be implemented as an integrated circuit.

The data driving circuit 120 may be implemented including one or more data signal generating circuits. The data signal generating circuit may include a shift register, a latch circuit, a digital-to-analog converter, an output buffer, and the like. In some cases, the data signal generating circuit may further include an analog-to-digital converter.

The data driving circuit 120 may be connected to the bonding pads of the display panel 110 or directly disposed on the display panel 110 by a tape automated bonding (TAB) method, a chip on glass (COG) or chip on panel (COP) method or may be integrated to the display panel 110. Further, the plurality of data driving circuits 120 may be implemented in a chip on film (COF) fashion, mounted on a source-circuit film connected to the display panel 110.

The gate driving circuit sequentially supplies gate signals to the plurality of gate lines GL to drive the plurality of pixels PX connected to the plurality of gate lines GL. The gate driving circuit may include shift registers, level shifters, etc.

The gate driving circuit may be connected to the bonding pads of the display panel 110 by a tape automated bonding (TAB) method, a chip on glass (COG), chip on panel (COF) method, or chip on film (COF) method or may be integrated to the display area DA or bezel area BA of the display panel 110.

When the gate driving circuit is disposed in the display area DA, it may be disposed in a separate space between the plurality of pixels PX. In this case, the scan driving circuit or emission driving circuit constituting the gate driving circuit may be separated and disposed between the plurality of pixels PX.

When the gate driving circuit is disposed in the bezel area BA, it may be disposed in the non-display area NDA on the left and/or right side of the display panel 110. When the gate driving circuit is disposed in the bezel area BA on both the left and right sides of the display panel 110, the scan driving circuit and the emission driving circuit may be separated and disposed on the left and right sides, respectively, or be disposed symmetrically on both the sides.

Figure 2:
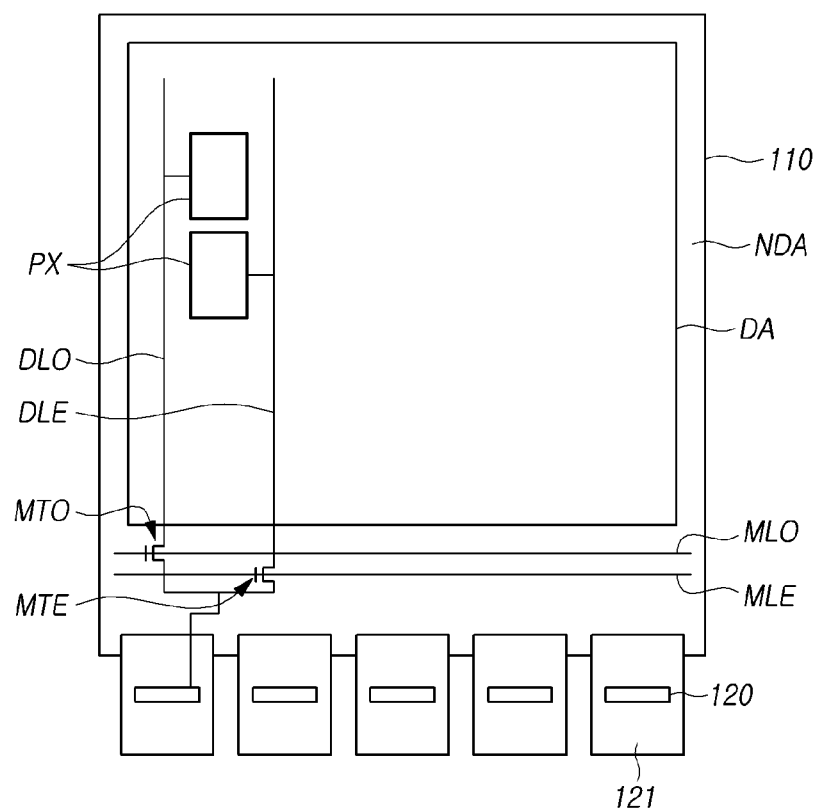
FIG. 2 is a view schematically illustrating a display panel according to an embodiment of the disclosure.

For convenience of description, FIGS. 1 and 2 illustrate an embodiment where the gate driving circuit is disposed directly in the bezel area BA of the display panel 110.

The plurality of gate lines GL disposed on the display panel 110 may be disposed in the row direction, and the plurality of data lines DL may be disposed in the column direction. Thus, the data driving circuit 120 may be located on the top side of the display panel 110, and the gate driving circuit may be located on both the left and right sides of the display panel 110.

The gate driving circuit sequentially supplies a gate signal of a transistor turn-on voltage or a transistor turn-off voltage to the plurality of gate lines GL, under the control of the controller 130. If a signal is provided to a specific gate line by the gate driving circuit, the data driving circuit 120 converts the image data received from the controller 130 into an analog data signal and supplies it to the plurality of data lines DL.

The plurality of gate lines GL disposed on the display panel 110 may include a plurality of scan lines and a plurality of emission lines. The plurality of scan lines and the plurality of emission lines are lines that transfer different kinds of gate signals to the gate electrodes of different transistors.

Thus, the gate driving circuit may include a plurality of scan driving circuits that output scan signals to the plurality of scan lines, and a plurality of emission driving circuits that output emission signals to the emission lines.

The electroluminescent display device 100, according to an embodiment of the disclosure, may include a power supply unit. The power supply unit converts or maintains the power input to the electroluminescent display device 100 from outside the electroluminescent display device 100 into power suitable for driving the driving circuits included in the electroluminescent display device 100. The power supply unit may be implemented as a single integrated circuit which is a semiconductor integrated device implemented separately from the gate driving circuit, the data driving circuit 120, and the controller 130. The power supply unit ramps up the input voltage when the electroluminescent display device 100 is turned on, and outputs the required voltage to the controller 130 or display panel 110.

FIG. 2 is a view schematically illustrating a display panel 110 according to an embodiment of the disclosure.

Referring to FIG. 2, a plurality of films 121 including lines are attached to one side of the display panel 110, and the data driving circuit 120 is disposed on each of the plurality of films 121. As described above, the data driving circuit 120 is illustrated as being implemented in a chip-on-film fashion, and depending on the size of the display panel 110 or the number of pixels PX, a single film 121 or multiple films 121 may be attached to the display panel 110.

In the display area DA, the data lines DL are disposed, two per pixel column. The pixel column refers to pixels PX disposed perpendicular to one side surface of the display panel 110 where the plurality of films 121 are disposed. In one pixel column, an odd-numbered data line DLO and an even-numbered data line DLE are disposed. The odd-numbered data line DLO is connected to the odd-numbered pixels among the pixels disposed in the pixel column. The even-numbered data line DLE is connected to the even-numbered pixels among the pixels disposed in the pixel column.

The odd-numbered data line DLO and the even-numbered data line DLE are connected to the multiplexer and are connected to the data driving circuit 120 via one data link line. The multiplexer includes an odd-numbered transistor MTO and an even-numbered transistor MTE. The odd-numbered transistor MTO is connected to the odd-numbered data line DLO, and the even-numbered transistor MTE is connected to the even-numbered data line DLE.

The odd-numbered transistor MTO is controlled through the odd-numbered signal line MLO to provide data signals to odd-numbered pixels, and the even-numbered transistor MTE is controlled through the even-numbered signal line MLE to provide data signals to even-numbered pixels.

As electroluminescent displays increase in resolution and size, the vertical resolution of the display panel increases, reducing the sampling time to compensate for the characteristics of the driving transistors. To address this issue, two data lines may be applied to one single pixel row. In this case, since two data lines are disposed on one single pixel, the width of the power line is reduced, which increases the resistance of the power line.

Since the resistance of the power line causes a voltage drop, it is necessary to implement the display panel by the double feeding method, which inputs power voltage from both ends of the power line to offset it. However, if the display panel is implemented in the double feeding method, the cost of the circuitry may increase. Thus, other methods are needed.

The display panel 110 according to an embodiment of the disclosure may be implemented in a single feeding method rather than the double feeding method by applying a pixel driving circuit capable of compensating for voltage drops in the power line, thereby reducing the manufacturing cost of the display panel 110. A pixel driving circuit that may compensate for voltage drops in the power supply line is described below with reference to FIGS. 6 and 7.

Figure 3:
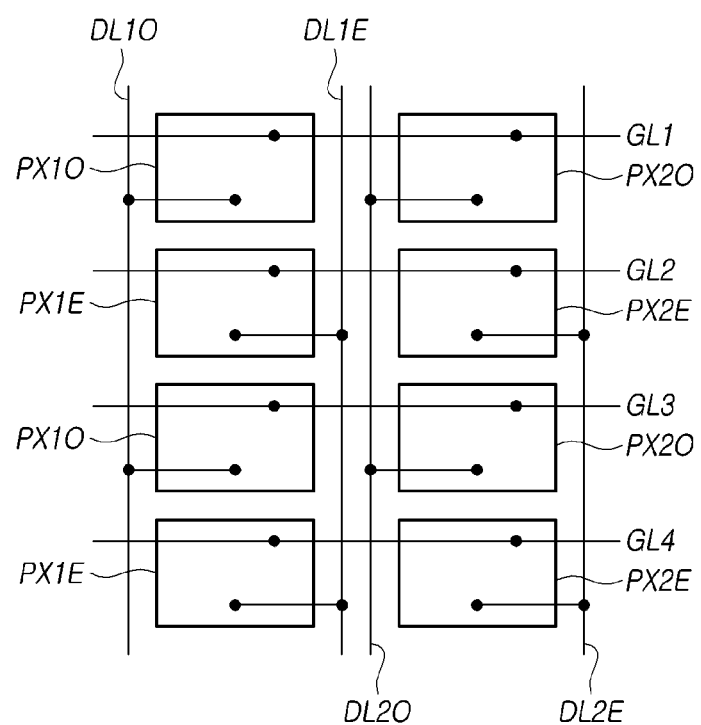
FIG. 3 is a view schematically illustrating components disposed in a display area of a display panel according to an embodiment of the disclosure.

FIG. 3 is a view schematically illustrating components disposed in a display area of a display panel according to an embodiment of the disclosure.

FIG. 3 illustrates two pixel columns disposed adjacent on the display panel 110. When two adjacent pixel columns are referred to as a first pixel column and a second pixel column, respectively, the odd-numbered pixels in the first pixel column may be referred to as first odd-numbered pixels PX1O, the even-numbered pixels in the first pixel column may be referred to as first even-numbered pixels PX1E, the odd-numbered pixels in the second pixel column may be referred to as second odd-numbered pixels PX2O, and the even-numbered pixels in the second pixel column may be referred to as second even-numbered pixels PX2E.

The first odd-numbered data line DL1O and the first even-numbered data line DL1E may be disposed on the left and right sides, respectively, of the first pixel column, and the second odd-numbered data line DL2O and the second even-numbered data line DL2E may be disposed on the left and right sides, respectively, of the second pixel column. The positions of odd-numbered data lines and even-numbered data lines may be changed.

The first odd-numbered data line DL1O is connected to the first odd-numbered pixels PX1O to provide data signals, and the first even-numbered data line DL1E is connected to the first even-numbered pixels PX1E to provide data signals. The second odd-numbered data line DL2O is connected to the second odd-numbered pixels PX2O to provide data signals, and the second even-numbered data line DL2E is connected to the second even-numbered pixels PX2E to provide data signals.

One gate line GL is disposed in each pixel row. The pixel row refers to pixels PX disposed in a direction crossing the pixel column. The first odd-numbered pixels PX1O and the second odd-numbered pixels PX2O disposed in the first pixel row may be connected to the first gate line GL1, the first even-numbered pixels PX1E and the second even-numbered pixel PX2E disposed in the second pixel row may be connected to the second gate line GL2, the first odd-numbered pixel PX1O and the second odd-numbered pixel PX2O disposed in the third pixel row may be connected to the third gate line GL3, and the first even-numbered pixel PX1E and the second even-numbered pixel PX2E disposed in the fourth pixel row may be connected to the fourth gate line GL4. As such, two data lines and one gate line are disposed in one pixel area, and the pixels PX in the pixel area are connected with one data line and one gate line.

It is possible to perform high-speed driving and secure a sampling time of two vertical periods or more in the sampling and programming period of the pixel driving circuit for compensating for the threshold voltage of the driving transistor by disposing two data lines per pixel row and connecting the odd-numbered pixels and even-numbered pixels to different data lines in the display panel 110.

While only two pixel columns and four pixel rows are shown in FIG. 3, hundreds to thousands of pixel rows and pixel columns may be disposed on the display panel 110 without limitations thereto.

Figure 4:
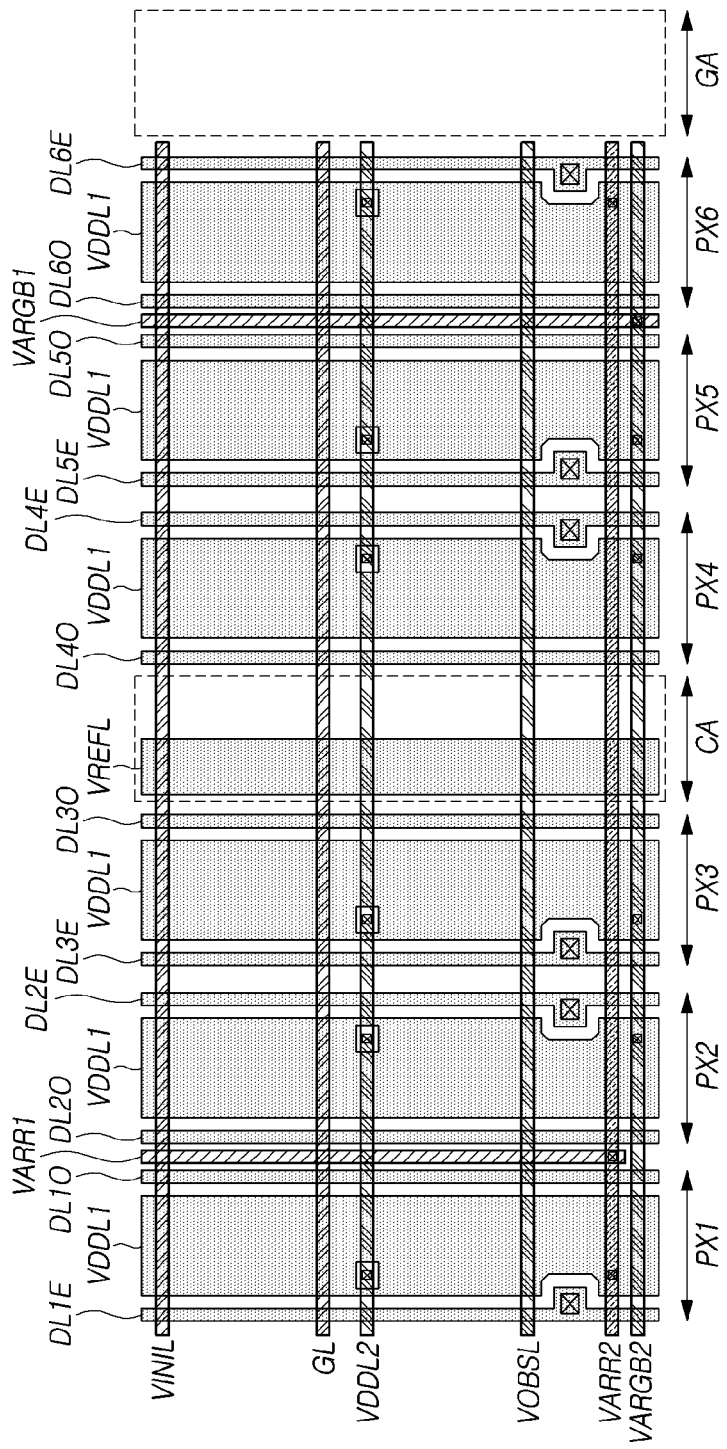
FIG. 4 is a layout view illustrating gate signals and voltage lines disposed in a display area of a display panel according to an embodiment of the disclosure.

FIG. 4 is a layout view illustrating gate signals and voltage lines disposed in a display area of a display panel according to an embodiment of the disclosure.

FIG. 4 illustrates a first pixel PX1, a second pixel PX2, a third pixel PX3, a fourth pixel PX4, a fifth pixel PX5, and a sixth pixel PX6 disposed in one pixel row. The pixel is the smallest unit for displaying color and grayscale, and may display red, green, blue, or white. For example, the first pixel PX1 and the fourth pixel PX4 may display red, the second pixel PX2 and the fifth pixel PX5 may display green, and the third pixel PX3 and the sixth pixel PX6 may display blue. The pixels displaying red, green, and blue together may be defined as a unit pixel. In this case, the first pixel PX1, second pixel PX2, and third pixel PX3 are referred to as a first unit pixel, and the fourth pixel PX4, fifth pixel PX5, and sixth pixel PX6 are referred to as a second unit pixel.

In the display panel 110, a common area CA is disposed between neighboring unit pixels, i.e., the first unit pixel and the second unit pixel and is electrically connected to the first unit pixel and the second unit pixel. A gate driving circuit area GA may be disposed on a side surface of the first unit pixel where the common area CA is not disposed or on a side surface of the second unit pixel where the common area CA is not disposed. As described above, one common area CA and one gate driving circuit area GA may be disposed every two unit pixels on the display panel 110, but the disclosure is not limited thereto. For example, when the gate driving circuit is disposed in the bezel area BA, the common area CA may be disposed every unit pixel.

In the common area CA, a control circuit and a reference voltage line VREFL are disposed to compensate for voltage drops in the power line by providing a reference voltage. The gate driving circuit providing the scan signal and emission signal of the pixel driving circuit is disposed in the gate driving circuit area GA.

The non-display area NDA of the display panel 110 may be reduced by disposing the common area CA and the gate driving circuit area GA in the display area DA of the display panel 110 according to an embodiment of the disclosure.

A light emitting element and a pixel driving circuit providing a driving current to the light emitting element are disposed in each pixel, and a gate signal, a data signal, and a power voltage are provided to the pixel driving circuit. To that end, the gate line GL providing the gate signal, the data line DL providing the data signal, and the power line providing voltage are disposed in each pixel. As described above, two data lines DL are disposed per pixel.

The first even-numbered data line DL1E and the first odd-numbered data line DL1O are disposed in the first pixel PX1 included in the first unit pixel, the second odd-numbered data line DL2O and the second even-numbered data line DL2E are disposed in the second pixel PX2, and the third even-numbered data line DL3E and the third odd-numbered data line DL3O are disposed in the third pixel PX3. In this case, the first pixel PX1 and the second pixel PX2 may be symmetrically positioned with respect to each other. Therefore, the first odd-numbered data line DL1O and the second odd-numbered data line DL2O may be disposed adjacent to each other, and the second even-numbered data line DL2E and the third even-numbered data line DL3E may be disposed adjacent to each other.

Similarly, the fourth odd-numbered data line DL4O and the fourth even-numbered data line DL4E are disposed in the fourth pixel PX4 included in the second unit pixel, the fifth even-numbered data lines DL5E and the fifth odd-numbered data line DL5O are disposed in the fifth pixel PX5, and the sixth odd-numbered data line DL6O and the sixth even-numbered data line DL6E are disposed in the sixth pixel PX6. In this case, the fifth pixel PX5 and the sixth pixel PX6 may be symmetrically positioned with respect to each other. Therefore, the fourth even-numbered data line DL4E and the fifth even-numbered data line DL5E may be disposed adjacent to each other, and the fifth odd-numbered data line DL5O and the sixth odd-numbered data line DL6O may be placed adjacent to each other.

The two adjacent units included in the display panel 110, i.e., the first unit and the second unit, may be disposed symmetrically with respect to each other.

Meanwhile, e.g., when the pixel rows (in which the first to sixth pixels PX1-PX6 are disposed) are even-numbered pixel rows, the pixels are electrically connected to even-numbered data lines.

The power line includes the reference voltage line VREFL, which provides the reference voltage, the high-potential voltage line, which provides the high-potential voltage, the reset voltage line, which provides the reset voltage, the initialization voltage line VINIL, which provides the initialization voltage, and the bias voltage line VOBSL.

Among them, the reference voltage line VREFL is disposed in the same direction as the data line, and the initialization voltage line VINIL and bias voltage line VOBSL are disposed in the same direction as the gate line. The high-potential voltage line and reset voltage line are in a mesh form and include all lines disposed in the same direction as the data line and gate line.

The high-potential voltage line includes a first high-potential voltage line VDDL1 disposed in the same direction as the data line and a second high-potential voltage line VDDL2 disposed in the same direction as the gate line. The first high-potential voltage line VDDL1 is disposed between the even-numbered data line and the odd-numbered data line disposed on each pixel. The first high-potential voltage lines VDDL1 disposed in the respective pixels are connected to one line in the non-display area NDA to receive the high-potential voltage. One second high-potential voltage line VDDL2 is disposed per pixel row. The first high-potential voltage line VDDL1 and the second high-potential voltage line VDDL2 may be disposed on different layers and electrically connected through contact holes.

The reset voltage line includes first reset voltage lines VARR1 and VARGB1 disposed in the same direction as the data line and second reset voltage lines VARR2 and VARGB2 disposed in the same direction as the gate line.

Each unit pixel is coupled with first reset voltage lines VARR1 and VARGB1, which include a first red reset voltage line VARR1 shared by the red pixels and the first green/blue reset voltage line VARGB1 shared by the green and blue pixels of the two unit pixels. The first red reset voltage line VARR1 is disposed in the first unit pixel, and the first green/blue reset voltage line VARGB1 is disposed in the second unit pixel. The first red reset voltage line VARR1 is disposed between the first odd-numbered data line DL1O and the second odd-numbered data line DL2O, and the first green/blue reset voltage line VARGB1 is disposed between the fifth odd-numbered data line DL5O and the sixth odd-numbered data line DL6O, but the disclosure is not limited thereto.

The second reset voltage lines VARR2 and VARGB2 are disposed, one per pixel row, and include a second red reset voltage line VARR2 electrically connected to the first red reset voltage line VARR1 and the red pixels included in the pixel row and a second green/blue reset voltage line VARGB2 electrically connected to the first green/blue reset voltage line VARGB1 and the green and blue pixels included in the pixel row.

The reset voltage lines are separated into the reset voltage line applied to the red pixel and the reset voltage line applied to the green and blue pixels and disposed on the display panel 110. This is why red light emitting elements deteriorate more easily than green and blue light emitting elements. Therefore, the arrangement of the reset voltage lines is not limited thereto, and depending on the characteristics of the light emitting element, the green or blue elements may be separately disposed, or may be disposed in one line without being divided by pixel.

In the display panel 110 according to an embodiment of the disclosure, it is possible to enhance the voltage uniformity of the entire display panel 110 and prevent voltage drops by disposing the high-potential voltage lines and reset voltage lines in a mesh form.

Figure 5:
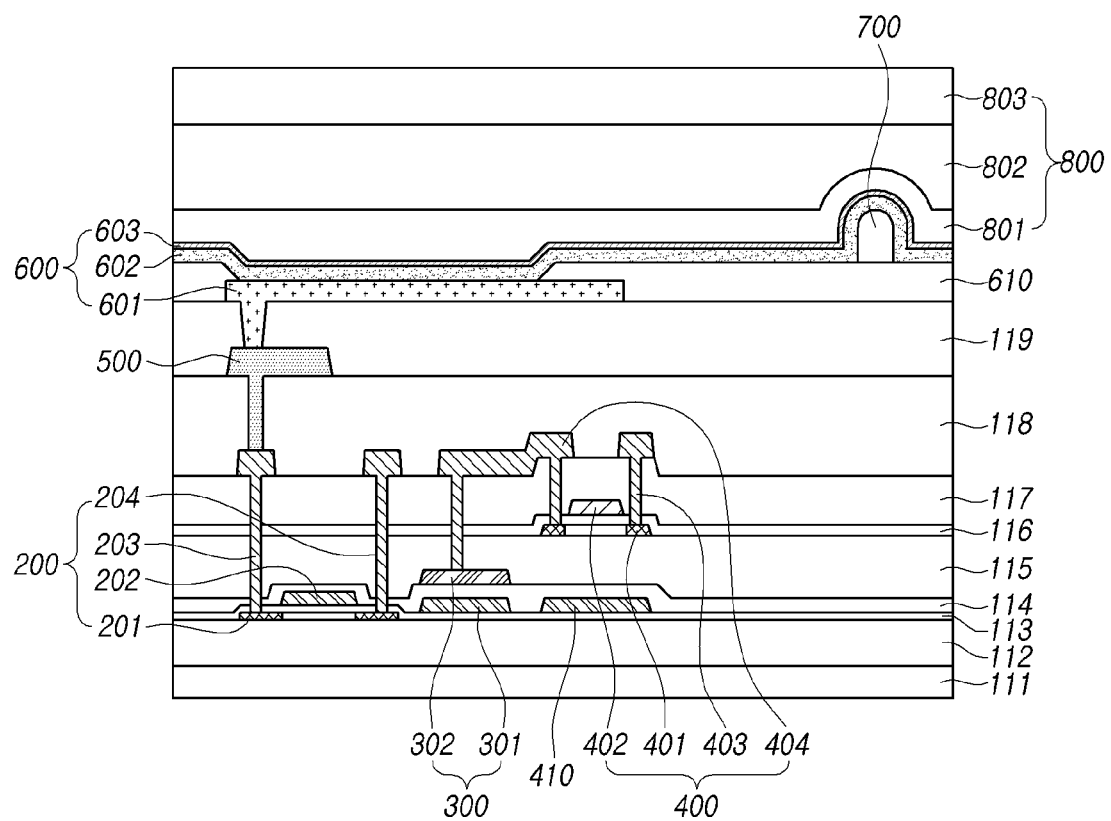
FIG. 5 is a cross-sectional view illustrating a display panel according to an embodiment of the disclosure.

FIG. 5 is a cross-sectional view illustrating a display panel according to an embodiment of the disclosure.

FIG. 5 is a cross-sectional view illustrating two switching thin film transistors 200 and 400 and one capacitor 300. The two thin film transistors 200 and 400 include either a switching thin film transistor or a driving transistor containing a polycrystalline semiconductor material and an oxide thin film transistor including an oxide semiconductor material. In this case, the thin film transistor containing the polycrystalline semiconductor material is referred to as a polycrystalline thin film transistor 200, and the thin film transistor including the oxide semiconductor material is referred to as an oxide thin film transistor 400.

The polycrystalline thin film transistor 200 shown in FIG. 5 is an emission switching thin film transistor connected to the light emitting element 600, and the oxide thin film transistor 400 is any one switching thin film transistor connected to the capacitor 300.

One pixel PX includes a light emitting element 600 and a pixel driving circuit that applies a driving current to the light emitting element 600. The pixel driving circuit is disposed on the substrate 111, and the light emitting element 600 is disposed on the pixel driving circuit. An encapsulation layer 800 is disposed on the light emitting element 600. The encapsulation layer 800 protects the light emitting element 600.

The pixel driving circuit may refer to one pixel (PX) array unit including a driving thin film transistor, a switching thin film transistor, and a capacitor. The light emitting element 600 may refer to an array unit for emitting light, including an anode electrode, a cathode electrode, and a light emitting layer disposed therebetween.

In an embodiment of the disclosure, the driving thin film transistor and at least one switching thin film transistor use an oxide semiconductor as an active layer. The thin film transistor using an oxide semiconductor material as an active layer may have an excellent leakage current blocking effect and is relatively inexpensive to manufacture as compared to the thin film transistor using a polycrystalline semiconductor material as an active layer. Therefore, to reduce power consumption and manufacturing costs, the pixel driving circuit according to an embodiment of the disclosure includes a driving thin film transistor using an oxide semiconductor material and at least one switching thin film transistor.

All of the thin film transistors constituting the pixel driving circuit may be implemented of an oxide semiconductor material while only some switching thin film transistors may be implemented of an oxide semiconductor material.

As the thin film transistor using an oxide semiconductor material has difficulty in securing reliability while the thin film transistor using a polycrystalline semiconductor material has superior reliability and high operation speed, an embodiment of the disclosure includes both the switching thin film transistor using an oxide semiconductor material and the switching thin film transistor using a polycrystalline semiconductor material.

The substrate 111 may be implemented in a multi-layer structure in which organic films and inorganic films are alternately stacked. For example, the substrate 111 may be formed as a multi-layer structure in which organic films, such as polyimide, and inorganic films, such as silicon oxide $SiO_2$, are alternately stacked.

A lower buffer layer 112 is formed on the substrate 111. The lower buffer layer 112 is to block moisture that may penetrate from the outside, and may be formed by stacking multiple layers of silicon oxide $SiO_x$. An auxiliary buffer layer may be further disposed on the lower buffer layer 112 to protect the device from moisture permeation.

A polycrystalline thin film transistor 200 is formed on the substrate 111. The polycrystalline thin film transistor 200 may use a polycrystalline semiconductor as an active layer. The polycrystalline thin film transistor 200 includes a first active layer 201 including a channel through which electrons or holes move, a first gate electrode 202, a first source electrode 203, and a first drain electrode 204.

The first active layer 201 includes a first channel area and a first source area and a first drain area on two opposite sides of the first channel area.

The first source area and the first drain area are areas which have been rendered conductive by doping an intrinsic polycrystalline semiconductor material with a predetermined concentration of group 5 or group 3 impurity ions, such as of phosphorus (P) or boron (B). The first channel area maintains an intrinsic state of the polycrystalline semiconductor material and provides a path for electrons or holes to move.

Meanwhile, the polycrystalline thin film transistor 200 includes a first gate electrode 202 overlapping the first channel area of the first active layer 201. A first gate insulation layer 113 is disposed between the first gate electrode 202 and the first active layer 201. The first gate insulation layer 113 may be formed of a single inorganic layer of, or a stack of multiple inorganic layers of silicon oxide ($SiO_2$) film or a silicon nitride ($SiN_x$).

In an embodiment of the disclosure, the polycrystalline thin film transistor 200 has a top gate structure in which the first gate electrode 202 is positioned above the first active layer 201. Accordingly, the first electrode 301 included in the capacitor 300 and the light blocking layer 410 included in the oxide thin film transistor 400 may be formed of the same material as the first gate electrode 202. By forming the first gate electrode 202, the first electrode 301, and the light blocking layer 410 through a single mask process, the number of mask processes may be reduced.

The first gate electrode 202 is formed of a metal material. For example, the first gate electrode 202 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

A first inter-layer insulation layer 114 is disposed on the first gate electrode 202. The first inter-layer insulation layer 114 may be implemented of silicon oxide ($SiO_2$), silicon nitride ($SiN_x$), or the like.

The polycrystalline thin film transistor 200 may further include an upper buffer layer 115, a second gate insulation layer 116, and a second inter-layer insulation layer 117 sequentially disposed on the first inter-layer insulation layer 114, and includes a first source electrode 203 and a first drain electrode 204 formed on the second inter-layer insulation layer 117 and connected with the first source area and the first drain area, respectively.

The first source electrode 203 and the first drain electrode 204 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

The upper buffer layer 115 spaces the second active layer 401 of the oxide thin film transistor 400 formed of the oxide semiconductor material apart from the first active layer 201 formed of the polycrystalline semiconductor material, and provides a basis for forming the second active layer 401.

The second gate insulation layer 116 covers the second active layer 401 of the oxide thin film transistor 400. Since the second gate insulation layer 116 is formed on the second active layer 401 formed of an oxide semiconductor material, it is implemented as an inorganic film. For example, the second gate insulation layer 116 may be silicon oxide ($SiO_2$), silicon nitride ($SiN_x$), or the like.

The second gate electrode 402 may be formed of a metal material. For example, the second gate electrode 402 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

Meanwhile, the oxide thin film transistor 400 includes a second active layer 401 formed on the upper buffer layer 115 and formed of an oxide semiconductor material, a second gate insulation layer 116 covering the second active layer 401, a second gate electrode 402 disposed on the second gate insulation layer 116, a second inter-layer insulation layer 117 covering the second gate electrode 402, and a second source electrode 403 and a second drain electrode 404 disposed on the second inter-layer insulation layer 117.

The second active layer 401 is formed of an oxide semiconductor material and includes an intrinsic second channel area that is not doped with impurities, and a second source area and a second drain area that are doped with impurities to be rendered conductive.

The oxide thin film transistor 400 further includes a light blocking layer 410 positioned under the upper buffer layer 115 and overlapping the second active layer 401. The light blocking layer 410 blocks light from reaching the active layer 401 to secure reliability of the oxide thin film transistor 400. The light blocking layer 410 may be formed of the same material as the first gate electrode 202 and may be formed on an upper surface of the first gate insulation layer 113. The light blocking layer 410 may be electrically connected to the second gate electrode 402 to form a dual-gate.

The second source electrode 403 and the second drain electrode 404, along with the first source electrode 203 and the first drain electrode 204, may be simultaneously formed of the same material on the second inter-layer insulation layer 117 to reduce the number of mask processes.

Meanwhile, the capacitor 300 may be implemented by disposing the second electrode 302 on the first inter-layer insulation layer 114 to overlap the first electrode 301. The second electrode 302 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu).

The capacitor 300 stores the data voltage applied through the data line DL for a certain period of time and then provides it to the light emitting element 600. The capacitor 300 includes two electrodes corresponding to each other and a dielectric disposed therebetween. A first inter-layer insulation layer 114 is positioned between the first electrode 301 and the second electrode 302.

The first electrode 301 or the second electrode 302 of the capacitor 300 may be electrically connected to the second source electrode 403 or the second drain electrode 404 of the oxide thin film transistor 400. However, the connection relationship of the capacitor 300 may be changed according to the pixel driving circuit without being limited thereto.

Meanwhile, a first planarization layer 118 and a second planarization layer 119 are sequentially disposed on the pixel driving circuit to planarize an upper end of the pixel driving circuit. The first planarization layer 118 and the second planarization layer 119 may be an organic film, such as polyimide or acrylic resin.

A light emitting element 600 is formed on the second planarization layer 119.

The light emitting element 600 includes an anode electrode 601, a cathode electrode 603, and a light emitting layer 602 disposed between the anode electrode 601 and the cathode electrode 603. When implemented as a pixel driving circuit that commonly uses a low-potential voltage connected to the cathode electrode 603, the anode electrode 601 is disposed as a separate electrode for each subpixel. In the case of implementing a pixel driving circuit that commonly uses a high-potential voltage, the cathode electrode 603 may be disposed as a separate electrode for each subpixel.

The light emitting element 600 is electrically connected to the driving element through the intermediate electrode 500 disposed on the first planarization layer 118. Specifically, the anode electrode 601 of the light emitting element 600 and the first source electrode 203 of the polycrystalline thin film transistor 200 constituting the pixel driving circuit are connected to each other through the intermediate electrode 500.

The anode electrode 601 is connected to the intermediate electrode 500 exposed through a contact hole penetrating the second planarization layer 119. Further, the intermediate electrode 500 is connected to the first source electrode 203 exposed through a contact hole penetrating the first planarization layer 118.

The intermediate electrode 500 serves as a medium connecting the first source electrode 203 and the anode electrode 601. The intermediate electrode 500 may be formed of a conductive material, such as copper (Cu), silver (Ag), molybdenum (Mo), or titanium (Ti).

The anode electrode 601 may be formed in a multilayer structure including a transparent conductive film and an opaque conductive film having high reflection efficiency. The transparent conductive film may be formed of a material with a relatively high work function value, such as indium-tin-oxide (ITO) or indium-zinc-oxide (IZO), and the opaque conductive film may be formed of a single layer or a multilayer structure including aluminum (Al), silver (Ag), copper (Cu), lead (Pb), molybdenum (Mo), titanium (Ti) or an alloy thereof. For example, the anode electrode 601 may be formed of a structure in which a transparent conductive film, an opaque conductive film, and a transparent conductive film are sequentially stacked, or a structure in which a transparent conductive film and an opaque conductive film are sequentially stacked.

The light emitting layer 602 is formed in the order of hole-related layer, organic light emitting layer, and electron-related layer, or its reverse order, on the anode electrode 601.

The bank layer 610 may be a pixel defining layer exposing the anode electrode 601 of each pixel PX. The bank layer 610 may be formed of an opaque material (e.g., black) to prevent light interference between adjacent pixels PX. In this case, the bank layer 610 includes a light blocking material formed of at least one of color pigments, organic black, and carbon. A spacer 700 may be further disposed on the bank layer 610.

The cathode electrode 603 faces the anode electrode 601 with the light emitting layer 602 interposed therebetween and is formed on the top and side surfaces of the light emitting layer 602. The cathode electrode 603 may be integrally formed over the entire display area DA. The cathode electrode 603 may be formed of a transparent conductive layer, such as indium tin oxide (ITO) or indium zinc oxide (IZO) when applied to a top emission-type organic light emitting display device.

An encapsulation layer 800 that suppresses moisture permeation may be further disposed on the cathode electrode 603. The encapsulation layer 800 may include a first inorganic encapsulation layer 801, an organic encapsulation layer 802, and a second inorganic encapsulation layer 803 sequentially stacked.

The first inorganic encapsulation layer 801 and the second inorganic encapsulation layer 803 of the encapsulation layer 800 may be formed of an inorganic material, such as silicon oxide (SiOx). The organic encapsulation layer 802 of the encapsulation layer 800 may be formed of an organic material, such as acrylic resin, epoxy resin, phenolic resin, polyamide resin, and polyimide resin.

Figure 6:
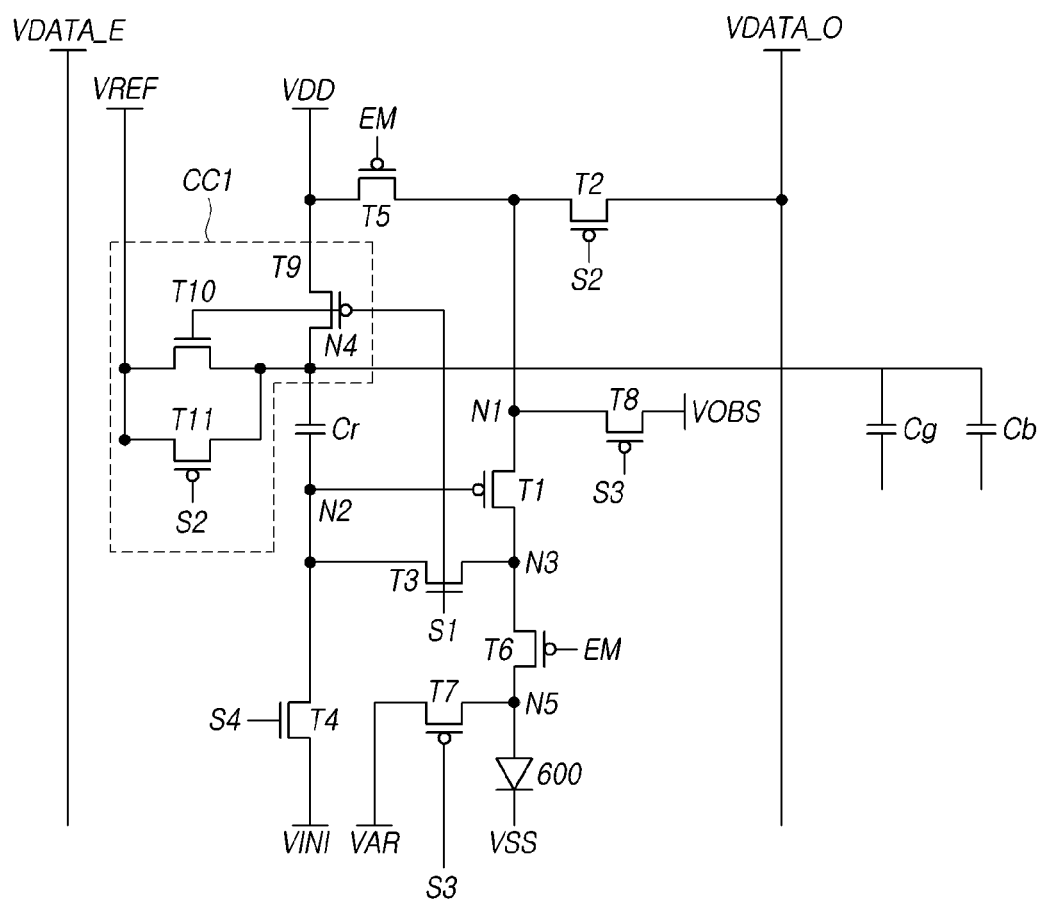
FIGS. 6 and 7 are circuit diagrams illustrating a pixel driving circuit according to an embodiment of the disclosure.
Figure 7:
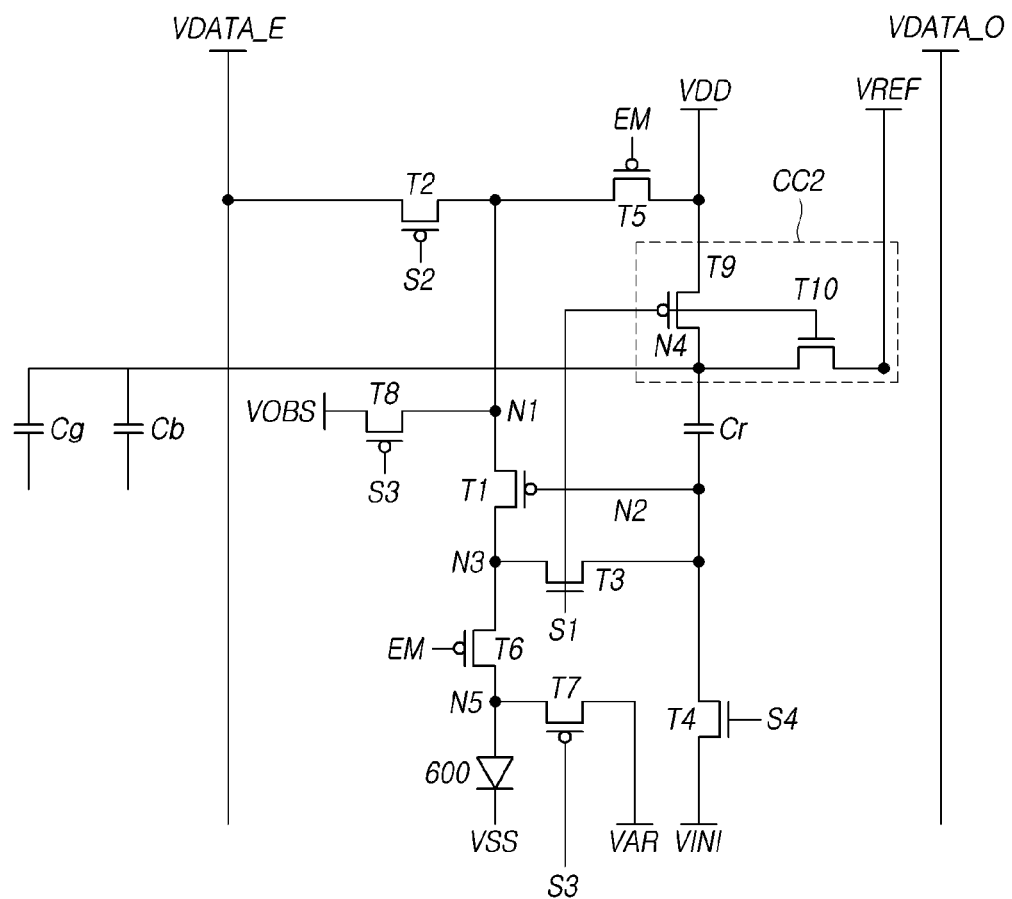
Figure 8:
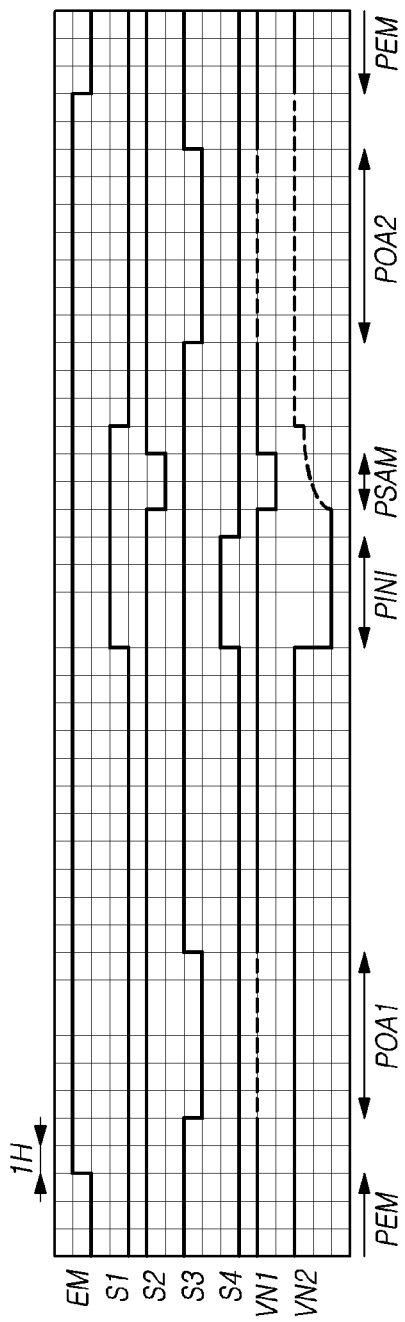
FIG. 8 is a view illustrating waveforms of signals input to a pixel driving circuit according to an embodiment of the disclosure.

FIG. 6 and FIG. 7 are circuit diagrams illustrating a pixel driving circuit according to an embodiment of the disclosure, and FIG. 8 is a waveform diagram of signals input to the pixel driving circuits of FIGS. 6 and 7.

FIG. 6 illustrates a pixel driving circuit included in odd-numbered pixels in a pixel row, and FIG. 7 illustrates a pixel driving circuit included in even-numbered pixels in the pixel row.

Referring to FIG. 6, the pixel PX includes a light emitting element 600 and a pixel driving circuit that controls the amount of current applied to the light emitting element 600. The pixel driving circuit provides a driving current to the light emitting element 600 so that the light emitting element 600 emits light.

The anode of the light emitting element 600 may be connected to the fifth node N5, and the pixel driving circuit may be electrically connected to the light emitting element 600 at the fifth node N5. In other words, the pixel driving circuit provides driving current to the fifth node N5.

Referring to FIGS. 6 and 7, in the pixel driving circuit according to an embodiment of the disclosure, gate signals including a first scan signal S1, a second scan signal S2, a third scan signal S3, a fourth scan signal S4, and an emission signal EM are provided through the gate driving circuit. The data voltages VDATA_E and VDATA_O are provided through the data driving circuit 120, and the power voltages including a high-potential voltage VDD, a low-potential voltage VSS, an initialization voltage VINI, a bias voltage VOBS, and a reset voltage VAR are provided from the power supply unit. In this case, the second scan signal S2, third scan signal S3, and emission signal EM are signals that control the P-type transistor, and the first scan signal S1 and fourth scan signal S4 are signals that control the N-type transistor.

The pixel driving circuit includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, and a capacitor Cst. The ninth transistor T9 may be referred to as a first common circuit transistor. The tenth transistor T10 may be referred to as a second common circuit transistor. The eleventh transistor T11 may be referred to as a third common circuit transistor. In this case, the first transistor T1 is a driving transistor. In an embodiment according to the disclosure, the first transistor T1, the second transistor T2, the fifth transistor T5, the sixth transistor T6, the seventh transistor T7, the eighth transistor T8, the ninth transistor T9, and the eleventh transistor T11 in the pixel driving circuit are P-type transistors, and the third transistor T3, fourth transistor T4, and tenth transistor T10 are N-type transistors in one embodiment. The N-type transistors may be implemented as oxide transistors.

The electroluminescent display device 100 according to an embodiment of the disclosure may employ low-speed driving to reduce power consumption. For example, assuming that the frame frequency of the electroluminescent display device 100 is 60 Hz, when low-speed driving is performed at a frequency lower than 60 Hz, the number of image frames into which the data voltage is written in low-speed driving is smaller than that of 60 Hz driving. In the 60 Hz driving, 60 image frames are reproduced per second, and data voltage write operation is performed in all 60 image frames. In contrast, in the low-speed driving, the data voltage write operation is performed only on some of the 60 image frames, and the data voltage written in the previous image frame is maintained in the remaining image frames. In other words, since the output operations of the data driving circuit 120 and the gate driving circuit are stopped in the remaining image frames in which the data voltage is not written, power consumption is reduced. Low-speed driving may be employed for still images or videos with infrequent image changes, and the update cycle of the data voltage is longer than that of 60 Hz driving. Accordingly, the time during which the voltage between the gate electrode and the source electrode of the driving transistor is maintained in the pixel driving circuit is longer during low-speed driving than during 60 Hz driving. During low-speed driving, it is necessary to maintain the voltage between the gate electrode and the source electrode of the driving transistor for a desired period of time. To that end, the switching transistors directly/indirectly connected to the gate electrode of the driving transistor may be implemented as oxide transistors that have good off characteristics. Meanwhile, the electroluminescent display device 100 according to an embodiment of the disclosure may selectively employ 60 Hz driving and low-speed driving depending on the characteristics of the input image.

The pixel driving circuit according to an embodiment of the disclosure may operate separately in a first OBS period POA1 an initialization period PINI, a sampling and programming period PSAM, a second OBS period POA2, and a light emission period PEM.

The first scan signal S1 includes pulses for turning on the third transistor T3 and the tenth transistor T10 in the initialization period PINI and sampling and programming period PSAM. The first scan signal S1 is a logic high voltage in the initialization period PINI and sampling and programming period PSAM. The first scan signal S1 turns on the ninth transistor T9 in the first OBS period POA1, the second OBS period POA2, and the light emission period PEM. The first scan signal S1 is a logic low voltage in the first OBS period POA1, the second OBS period POA2, and the light emission period PEM.

The second scan signal S2 includes pulses for turning on the second transistor T2 and the eleventh transistor T11 in the sampling and programming period PSAM. The second scan signal S2 is a gate low voltage in the sampling and programming period PSAM.

The third scan signal S3 includes pulses for turning on the seventh transistor T7 and the eighth transistor T8 in the first OBS period POA1 and the second OBS period POA2. The third scan signal S3 is a gate low voltage in the first OBS period POA1 and the second OBS period POA2. The third scan signal S3 is a signal for initializing the OBS of the first transistor T1 and the N5 node. In this case, OBS, short for on bias stress, refers to an operation of applying stress to the driving transistor to prevent fluctuations in the threshold voltage of the driving transistor. A hysteresis phenomenon in which the threshold voltage of the driving transistor fluctuates over time may appear as screen artifacts during low-speed driving. Thus, the OBS period may mitigate the hysteresis of the driving transistor and enhance frame response time.

The fourth scan signal S4 includes a pulse for turning on the fourth transistor T4 in the initialization period PINI. The fourth scan signal S4 is a gate high voltage in the initialization period PINI.

The emission signal EM includes pulses for turning off the fifth transistor T5 and sixth transistor T6 in the first OBS period POA1, the initialization period PINI, the sampling and programming period PSAM, and the second OBS period POA2, except for the light emission period PEM. The emission signal EM is a gate high voltage in the first OBS period POA1, the initialization period PINI, the sampling and programming period PSAM, and the second OBS period POA2. The pulses of the emission signal EM overlap the pulses of the first scan signal S1, the second scan signal S2, the third scan signal S3, the fourth scan signal S4, and the emission signal EM.

Elements constituting the pixel driving circuit in each driving period, signals input to the elements, and operations of the elements are described below.

The first transistor T1 is an element that provides driving current to the light emitting element 600, and the gate electrode of the first transistor T1 is connected to the second node N2, the source electrode is connected to the first node N1, and the drain electrode is connected to the third node N3.

The light emission period PEM ends when the fifth transistor T5 and sixth transistor T6 are turned off by the emission signal EM, followed by the first OBS period POA1 when the seventh transistor T7 and eighth transistor T8 are turned on by the third scan signal S3.

The gate electrode of the seventh transistor T7 is connected to the line provided with the third scan signal S3, the source electrode is connected to the line provided with the reset voltage VAR, and the drain electrode is connected to the fifth node N5.

In the first OBS period POA1, the seventh transistor T7 is turned on to apply the reset voltage VAR to the fifth node N5 to reset the anode of the light emitting element 600. In the first OBS period POA1, the reset voltage VAR is equal to or lower than the low-potential voltage VSS applied to the cathode of the light emitting element 600, and may be set to be sufficiently lower than the operating voltage of the light emitting element 600. The reset voltage VAR is a voltage that does not change and maintains a constant voltage level when driving the pixel driving circuit.

The gate electrode of the eighth transistor T8 is connected to the line provided with the third scan signal S3, the source electrode is connected to the line provided with the bias voltage VOBS, and the drain electrode is connected to the first node N1.

In the first OBS period POA1, the eighth transistor T8 is turned on to apply a bias voltage VOBS to the first node N1, which turns on the first transistor T1 to apply a certain stress. In the first OBS period POA1, the bias voltage VOBS is equal to or higher than the high-potential voltage VDD to turn on the first transistor T1 and keep it in a strong saturation state. In other words, the bias voltage VOBS provided through the turned-on eighth transistor T8 raises the source electrode of the first transistor T1 to the first OBS voltage VOBS1.

In the first OBS period POA1, the ninth transistor T9 maintains a turn-on state and applies the high-potential voltage VDD to the fourth node N4. Accordingly, the ninth transistor T9 may be referred to as a high-potential voltage providing circuit.

The first OBS period POA1 is followed by the initialization period PINI when the third transistor T3 and the tenth transistor T10 are turned on by the first scan signal S1, and the fourth transistor T4 is turned on by the fourth scan signal S4. Between the first OBS period POA1 and the initialization period PINI, the seventh transistor T7 and the eighth transistor T8 are turned off.

The gate electrode of the third transistor T3 is connected to the line provided with the first scan signal S1, and the source and drain electrodes of the third transistor T3 are connected to the second node N2 and the third node N3, respectively. In the initialization period PINI, the third transistor T3 is turned on to electrically connect the second node N2 and the third node N3. In this case, the gate electrode and the drain electrode of the first transistor T1 are conductive to each other.

The gate electrode of the fourth transistor T4 is connected to the line provided with the fourth scan signal S4, the source electrode is connected to the second node N2, and the drain electrode is connected to the line provided with the initialization voltage VINI. During the initialization period PINI, the fourth transistor T4 is turned on to apply the initialization voltage VINI to the second node N2, thereby discharging the gate electrode of the first transistor T1. In this case, the initialization voltage VINI is a voltage lower than the logic low voltage and is sufficiently low to initialize the gate electrode of the first transistor T1 while turning on the first transistor T1.

The gate electrode of the tenth transistor T10 is connected to the line provided with the first scan signal S1, the source electrode is connected to the line provided with the reference voltage VREF, and the drain electrode is connected to the fourth node N4. During the initialization period PINI, the tenth transistor T10 is turned on and the reference voltage VREF is applied to the fourth node N4.

The initialization period PINI is followed by the sampling and programming period PSAM when the second transistor T2 and the eleventh transistor T11 are turned on by the second scan signal S2. As described above, the sampling and programming period PSAM is equal to or larger than two horizontal periods. 1H, shown in FIG. 8, is one horizontal period.

The gate electrode of the second transistor T2 is connected to the line provided with the second scan signal S2, the source electrode is connected to the line provided with the data voltage VDATA_O to be provided to odd-numbered pixel rows, and the drain electrode is connected to the first node N1. In this case, the data voltage provided to odd-numbered pixel rows is referred to as a first data voltage VDATA_O.

The third transistor T3 maintains the turn-on state during the sampling and programming period PSAM following the initialization period PINI, to electrically connect the gate electrode and the drain electrode of the driving transistor T1 to form a diode connection state. During the sampling and programming period PSAM, the second transistor T2 is turned on to apply the first data voltage VDATA_O to the source electrode of the driving transistor T1.

The tenth transistor T10 also maintains a turn-on state during the sampling and programming period PSAM following the initialization period PINI, providing the reference voltage VREF to the fourth node N4.

The gate electrode of the eleventh transistor T11 is connected to the line provided with the second scan signal S2, the source electrode is connected to the line provided with the reference voltage VREF, and the drain electrode is connected to the fourth node N4. During the sampling and programming period PSAM, the eleventh transistor T11 is turned on so that the fourth node N4 is maintained at the reference voltage VREF without fluctuating. During the sampling and programming period PSAM, an abrupt increase in the voltage of the second node N2 may cause a coupling phenomenon of the capacitor Cr to affect the fourth node N4. Further, since the tenth transistor T10 that provides the reference voltage VREF to the fourth node N4 is a thin film transistor using an oxide semiconductor, it has low electrical conductivity and is thus vulnerable to the effects of the coupling phenomenon. Therefore, the eleventh transistor T11, which is a thin film transistor using a polycrystalline semiconductor, is placed between the fourth node N4 and the reference voltage line VREFL to maintain the reference voltage VREF at the fourth node N4 during the sampling and programming period PSAM. In this case, the tenth transistor T10 and the eleventh transistor T11 may be referred to as a reference voltage providing circuit.

During the sampling and programming period PSAM, current flows between the source and drain electrodes of the first transistor T1. Since the gate electrode and the drain electrode of the first transistor T1 are diode-connected, the voltage at the second node N2 is increased by the current flowing from the source electrode to the drain electrode until the voltage Vgs between the gate electrode and the source electrode of the first transistor T1 becomes the threshold voltage Vth of the first transistor T1.

In the sampling and programming period PSAM, the voltage of the second node N2 is charged to a voltage VDATA_O+Vth corresponding to the sum of the first data voltage VDATA_O and the threshold voltage Vth of the first transistor T1.

The capacitor Cr includes a first electrode connected to the second node N2 and a second electrode connected to the fourth node N4. In other words, the voltage VDATA_O+Vth of the second node N2 in the sampling and programming period PSAM is stored in the capacitor Cr until the light emitting period PEM, allowing the first transistor T1 to provide a constant driving current during the light emission period PEM.

The sampling and programming period PSAM is followed by the second OBS period POA2 when the seventh transistor T7 and eighth transistor T8 are turned on by the third scan signal S3.

In the second OBS period POA2, like the first OBS period POA1, a bias voltage VOBS is applied to the first node N1 through the turned-on eighth transistor T8 to turn on the first transistor T1, applying a certain stress to the driving transistor T1. In the second OBS period POA2, the bias voltage VOBS is equal to or higher than the high-potential voltage VDD to turn on the first transistor T1 and keep it in a strong saturation state. In other words, the bias voltage VOBS provided through the turned-on eighth transistor T8 raises the source electrode of the first transistor T1 to the second OBS voltage VOBS2. In this case, the value of Vgs becomes VDATA_O+Vth+VDD−VREF−VOBS2, which is less than the Vgs of the first transistor T1 in the light emission period PEM.

In the second OBS period POA2, the reset voltage VAR is again applied to the fifth node N5 through the turned-on seventh transistor T7, resetting the anode of the light emitting element 600. In the second OBS period POA2, the reset voltage VAR is equal to or lower than the low-potential voltage VSS applied to the cathode of the light emitting element 600, and may be set to be sufficiently lower than the operating voltage of the light emitting element 600.

The second OBS period POA2 is followed by the light emission period PEM. In the light emission period PEM, the fifth transistor T5 and the sixth transistor T6 are turned on by the emission signal EM.

The gate electrode of the fifth transistor T5 is connected to the line provided with the emission signal EM, the source electrode is connected to the line provided with the high-potential voltage VDD, and the drain electrode is connected to the first node N1.

The gate electrode of the sixth transistor T6 is connected to the line provided with the emission signal EM, the source electrode is connected to the third node N3, and the drain electrode is connected to the fifth node N5. The fifth transistor T5 and the sixth transistor T6 may be referred to as emission transistors.

In the light emission period PEM, the high-potential voltage VDD is provided to the source electrode of the first transistor T1 through the fifth transistor T5, and the third node N3 and the fifth node N5 are rendered conductive through the sixth transistor T6. The first transistor T1 is turned on by the voltage stored in the gate node and provides a driving current to the light emitting element 600. In this case, the driving current is proportional to (VREF− VDATA_O)$^2$.

The pixel driving circuit according to an embodiment of the disclosure may compensate for the threshold voltage Vth of the first transistor T1 and provides a driving current that does not include the high-potential voltage VDD to the light emitting element 600, thereby preventing a voltage drop in the high-potential voltage line VDDL.

Further, it is possible to reduce the width of the high-potential voltage line by adopting a pixel driving circuit that provides driving current without the high-potential voltage element, and it is also possible to reduce the bezel area by placing low-potential voltage lines. Referring to FIG. 4, instead of the first high-potential voltage line VDDL1 disposed in the third pixel PX3, a low-potential voltage line providing a low-potential voltage VSS may be disposed. For example, an additional line with a certain width is placed in the bezel area to prevent a voltage rise in the low-potential voltage line. Placing the low-potential voltage line inside the pixel considerably reduces the width of the additional line disposed in the bezel area.

Meanwhile, the pixel driving circuit according to an embodiment of the disclosure includes a first common circuit CC1. The first common circuit CC1 includes a ninth transistor T9, a tenth transistor T10, and an eleventh transistor T11 connected to the fourth node N4. The first common circuit CC1 is disposed in the common area CA between two adjacent unit pixels and is shared by the red, green, and blue pixels disposed in the two unit pixels. In other words, the fourth nodes N4 included in the pixel driving circuits disposed in the red, green, and blue pixels are electrically connected. The fourth node N4 that may be shared by the unit pixels is a node that is not affected by the data voltage. A circuit that provides a voltage to the fourth node N4 that is not affected by the data voltage is a common circuit. The common circuit applies a power voltage, not a data voltage such as the high-potential voltage VDD or the reference voltage Vref, to the fourth node N4.

For example, if the pixel driving circuit of FIG. 6 is disposed in the red pixel, the fourth node N4 is connected to the capacitor Cg of the green pixel and the capacitor Cb of the blue pixel, thereby providing the voltage, provided through the first common circuit CC1, to first electrodes of the capacitor Cg of the green pixel and the capacitor Cb of the blue pixel.

The pixel driving circuit according to an embodiment of the disclosure includes a first common circuit CC1 shared by at least two pixels, thereby implementing a high-resolution display panel and display device.

Referring to FIG. 7, the pixel driving circuit of FIG. 7 is disposed in the even-numbered pixel in the same pixel row as the pixel driving circuit of FIG. 6. Since the pixel driving circuit of FIG. 7 has the same components as the pixel driving circuit of FIG. 6 except for the first common circuit CC1 and the data voltage, descriptions of the same components will be omitted or simplified.

The pixel driving circuit of FIG. 6 and the pixel driving circuit of FIG. 7 are driven together at the same timing. The second transistor T2 included in the pixel driving circuit of FIG. 6 provides the first data voltage VDATA_O provided to the odd-numbered pixel row to the first node N1, whereas the second transistor T2 included in the pixel driving circuit of FIG. 7 provides the data voltage VDATA_E provided to the even-numbered pixel row to the first node N1. In this case, the data voltage provided to the even-numbered pixel row is referred to as the second data voltage VDATA_E.

The pixel driving circuit disposed in the even-numbered pixel includes a second common circuit CC2. The second common circuit CC2 includes the ninth transistor T9 and the tenth transistor T10 except for the eleventh transistor T11 in the first common circuit CC1.

Conversely, the first common circuit CC1 and the second common circuit CC2 may be included in even-numbered pixel and odd-numbered pixel, respectively.

Figure 9A:
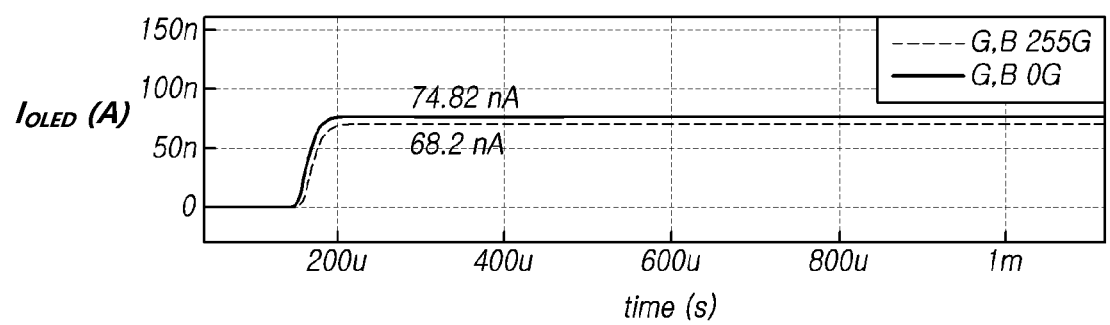
FIG. 9A is a graph illustrating a driving current over time in one subpixel according to a comparative embodiment of the disclosure.
Figure 9B:
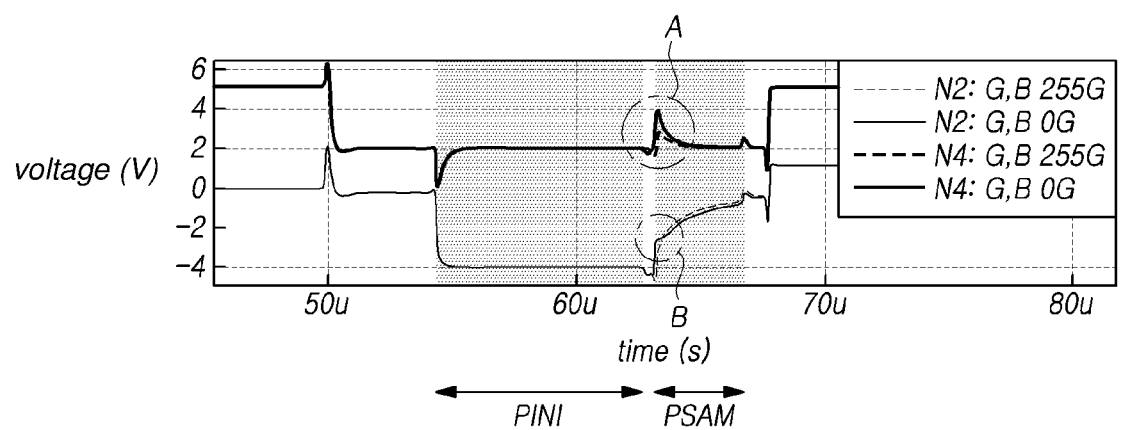
FIG. 9B is a graph illustrating a driving voltage over time in one subpixel according to a comparative embodiment of the disclosure.
Figure 10A:
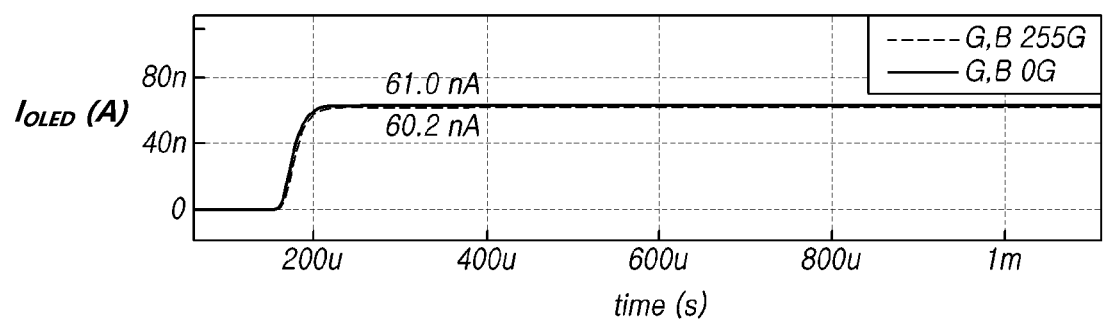
FIG. 10A is a graph illustrating a driving current over time in one subpixel according to an embodiment of the disclosure.
Figure 10B:
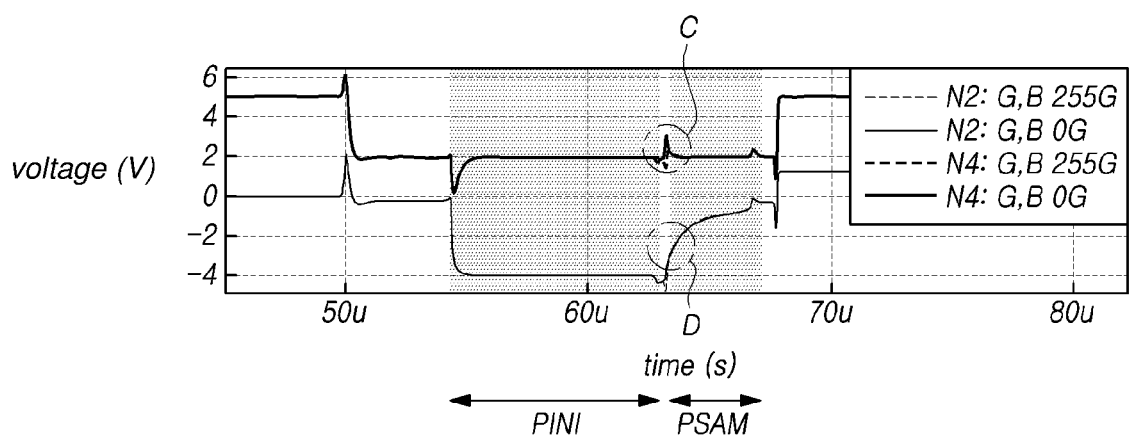
FIG. 10B is a graph illustrating a driving voltage over time in one subpixel according to an embodiment of the disclosure.

FIGS. 9A and 9B are graphs illustrating a driving current and voltage over time in one subpixel according to a comparative example. FIGS. 10A and 10B are graphs illustrating a driving current and voltage over time in one subpixel according to an embodiment.

FIGS. 9A and 9B show a driving current and voltage when the pixel driving circuit of FIG. 7 is applied.

FIG. 9A is a graph of a driving current waveform over time in a red pixel. The dashed line denotes the driving current waveform of the red pixel when the green and blue pixels that share the fourth node N4 with the red pixel are 255 G (black), and the solid line denotes the driving current waveform of the red pixel when the green and blue pixels that share the fourth node N4 with the red pixel are 0 G (white).

The driving current of the red pixel is saturated to a constant current value as 200 μs passes. When the green and blue pixels are 255 G, the driving current is 68.2 nA and, when the green and blue pixels are 0 G, the driving current is 74.8 nA. The difference in the driving current value of the red pixel depending on the grayscale is up to 4.62 nA, identifying that the driving current of the red pixel varies depending on the grayscale change of the green and blue pixels shared with the red pixel through the fourth node N4.

(FIG. 9B is a voltage waveform graph, over time in the red pixel, for a node shared by red, green, and blue pixels and the gate electrode of the driving transistor. The gate electrode of the driving transistor is the second node N2, and the node shared by the red, green, and blue pixels is the fourth node N4. In FIG. 9B, voltages in the initialization period PINI and the sampling and programming period PSAM may be identified.

The dashed line of the second node N2 denotes the voltage waveform of the gate electrode of the driving transistor included in the red pixel when the green and blue pixels sharing the fourth node N4 with the red pixel are 255 G (black), and the solid line of the second node N2 denotes the voltage waveform of the fourth node N4 when the green and blue pixels that share the fourth node N4 with the red pixel are 0 G (white).

It may be identified from area B of FIG. 9B that the two graphs are spaced apart from each other. Thus, it may be identified that the voltage of the second node N2 included in the red pixel varies depending on the grayscale change in the green and blue pixels that share the fourth node N4 with the red pixel.

The dashed line of the fourth node N4 denotes the voltage waveform of the fourth node N4 when the green and blue pixels sharing the fourth node N4 with the red pixel are 255

G (black), and the solid line of the fourth node N4 denotes the voltage waveform of the fourth node N4 when the green and blue pixels sharing the fourth node N4 with the red pixel are 0 G (white).

It may be identified from area A of FIG. 9B that the two graphs are spaced apart from each other, like in area B. It may be identified that the voltage of the fourth node N4 varies depending on the grayscale change in the green and blue pixels that share the fourth node N4 with the red pixel.

When the display panel according to an embodiment of the disclosure has a common node (the fourth node N4 in this case) commonly shared by the pixels, the gate electrode of the driving transistor and the common node may vary due to the coupling effect in the sampling and programming period, causing distortion of grayscale. Accordingly, a pixel circuit structure is required to compensate for this.

FIGS. 10A and 10B show the drive current and voltage when the pixel driving circuit of FIG. 6 is applied.

FIG. 10A is a graph of a driving current waveform over time in a red pixel. The dashed line denotes the driving current waveform of the red pixel when the green and blue pixels that share the fourth node N4 with the red pixel are 255 G (black), and the solid line denotes the driving current waveform of the red pixel when the green and blue pixels that share the fourth node N4 with the red pixel are 0 G (white).

The driving current of the red pixel is saturated to a constant current value as 200 µs passes. When the green and blue pixels are 255 G, the driving current is 60.2 nA and, when the green and blue pixels are 0 G, the driving current is 61.0 nA. The difference in the driving current value of the red pixel depending on the grayscale is up to 0.8 nA, identifying that the driving current of the red pixel is nearly invariant despite the grayscale change of the green and blue pixels shared with the red pixel through the fourth node N4.

FIG. 10B is a voltage waveform graph, over time in the red pixel, for a node shared by red, green, and blue pixels and the gate electrode of the driving transistor. The gate electrode of the driving transistor is the second node N2, and the node shared by the red, green, and blue pixels is the fourth node N4. In FIG. 10B, voltages in the initialization period PINI and the sampling and programming period PSAM may be identified.

The dashed line of the second node N2 denotes the voltage waveform of the gate electrode of the driving transistor included in the red pixel when the green and blue pixels sharing the fourth node N4 with the red pixel are 255 G (black), and the solid line of the second node N2 denotes the voltage waveform of the fourth node N4 when the green and blue pixels that share the fourth node N4 with the red pixel are 0 G (white).

A look at area D of FIG. 10B reveals that it is difficult to distinguish between the two graphs. Thus, it may be identified that the voltage of the second node N2 included in the red pixel is constant despite the grayscale change in the green and blue pixels that share the fourth node N4 with the red pixel.

The dashed line of the fourth node N4 denotes the voltage waveform of the fourth node N4 when the green and blue pixels sharing the fourth node N4 with the red pixel are 255 G (black), and the solid line of the fourth node N4 denotes the voltage waveform of the fourth node N4 when the green and blue pixels sharing the fourth node N4 with the red pixel are 0 G (white).

It may be identified from area C of FIG. 10B that the two graphs are identical, like in area D. It may be identified that the voltage of the fourth node N4 is constant despite the grayscale change in the green and blue pixels that share the fourth node N4 with the red pixel.

When the display panel according to an embodiment of the disclosure has a common node (the fourth node N4 in this case) commonly shared by the pixels and receiving the power voltage, it is possible to accurately represent the grayscale by applying a common circuit designed to be robust against the coupling to the pixel driving circuit to thereby maintain the voltage of the gate electrode of the driving transistor or common node constant in the sampling and programming period. This may be applied to the pixel driving circuits connected to all data lines.

A display panel and an electroluminescent display device including the same, according to embodiments of the disclosure, may be described as follows.

An electroluminescent display device according to an embodiment of the disclosure comprises a plurality of pixels including at least two pixels and a common circuit disposed between the plurality of pixels. Any one of the plurality of pixels includes a driving transistor including a first node, a second node, and a third node, a capacitor connected to a fourth node electrically shared by the plurality of pixels and the second node, a second transistor connected with the first node and a data line, and a light emitting element electrically connected with the driving transistor. The common circuit includes a high-potential voltage providing circuit providing a high-potential voltage to the fourth node and a reference voltage providing circuit providing a reference voltage.

According to another feature of the disclosure, the high-potential voltage providing circuit may include a ninth transistor connected to the fourth node and a high-potential voltage line. The reference voltage providing circuit may include a tenth transistor and an eleventh transistor connected to the fourth node and a reference voltage line. The tenth transistor may include an oxide semiconductor active layer.

According to another feature of the disclosure, the ninth transistor and the tenth transistor may be controlled by a first scan signal, and the eleventh transistor may be controlled by a second scan signal. The first scan signal and the second scan signal may have different pulse signals.

According to another feature of the disclosure, the electroluminescent display device may further comprise a gate driving circuit area spaced apart from the common circuit and disposed between the plurality of pixels.

According to another feature of the disclosure, a plurality of gate driving circuit areas may be provided. A driving circuit providing a gate signal for controlling transistors included in the one pixel may be disposed separately in the plurality of gate driving circuit areas. The plurality of gate driving circuit areas may include an area where the driving circuit is not disposed.

According to another feature of the disclosure, two data lines may be disposed in each of the plurality of pixels. Each of the plurality of pixels may be connected to one of the two data lines.

According to another feature of the disclosure, the plurality of pixels may be disposed in a direction in which the data lines are disposed. Even-numbered pixels among the plurality of pixels may be connected to one of the two data lines, and odd-numbered pixels among the plurality of pixels may be connected to the other of the two data lines.

The two data lines may be connected to a data link line. The electroluminescent display device may further comprise a multiplexer disposed between the two data lines and the data link line.

According to another feature of the disclosure, the electroluminescent display device may further comprise a third transistor connected to the second node and the third node and controlled by a first scan signal. The third transistor may include an oxide semiconductor active layer.

According to another feature of the disclosure, the electroluminescent display device may further comprise a fourth transistor connected to the second node and an initialization voltage line, wherein the fourth transistor includes an oxide semiconductor active layer.

According to another feature of the disclosure, the driving transistor may include a polycrystalline silicon semiconductor active layer.

According to another feature of the disclosure, the plurality of pixels may be divided into unit pixels including red, green, and blue pixels. The common circuit may be disposed between two unit pixels adjacent to each other and be electrically connected with pixels included in the two unit pixels.

A display panel according to another embodiment of the disclosure comprises a plurality of pixels and a unit pixel including the plurality of pixels. The unit pixel includes a first data line and a second data line included in each of the plurality of pixels, a first high-potential power line disposed between the first data line and the second data line, a first reset voltage line disposed on one side of the first data line or the second data line, and a reference voltage line parallel to the first reset voltage line, disposed on one side of the unit pixel, and electrically connected to a plurality of pixels included in the unit pixel. The reference voltage line is electrically connected to a plurality of pixels included in the unit pixel through a reference voltage providing circuit.

According to another feature of the disclosure, the reference voltage providing circuit may include an oxide thin film transistor and a polycrystalline thin film transistor controlled by different scan signals.

According to another feature of the disclosure, the display panel may further comprise a second high-potential power line crossing the first high-potential power line and overlapping the unit pixel.

According to another feature of the disclosure, the display panel may further comprise a second reset voltage line disposed to cross the first reset voltage line and overlap the unit pixel.

According to another feature of the disclosure, the unit pixel may include red, green, and blue pixels. The first reset voltage line may include a line connected to the red pixel of the unit pixel and a line connected to the green and blue pixels, and the second reset voltage line may include a line connected to the red pixel of the unit pixel and a line connected to the green and blue pixels.

A pixel driving circuit according to a further embodiment of the disclosure is disposed in each of a plurality of pixels. The pixel driving circuit comprises: a driving transistor electrically connected with a light emitting element, and including a first node, a second node and a third node; a capacitor connected to a fourth node electrically shared by the plurality of pixels and the second node; a second transistor connected with the first node and a data line; and a common circuit disposed between the plurality of pixels. The common circuit includes a high-potential voltage providing circuit providing a high-potential voltage to the fourth node and a reference voltage providing circuit providing a reference voltage.

According to another feature of the disclosure, the high-potential voltage providing circuit may include a ninth transistor connected to the fourth node and a high-potential voltage line, and the reference voltage providing circuit may include a tenth transistor and an eleventh transistor connected to the fourth node and a reference voltage line.

According to another feature of the disclosure, the pixel driving circuit may further comprise a third transistor connected to the second node and the third node and controlled by a first scan signal.

According to another feature of the disclosure, the pixel driving circuit may further comprise a fourth transistor connected to the second node and an initialization voltage line, wherein the fourth transistor includes an oxide semiconductor active layer.

Although the embodiments of the disclosure have been described in more detail with reference to the accompanying drawings, the disclosure is not necessarily limited to these embodiments, and may be variously modified without departing from the technical spirit of the disclosure. Accordingly, the embodiments set forth herein are provided for illustrative purposes, but not to limit the scope of the disclosure, and should be appreciated that the scope of the disclosure is not limited by the embodiments. Thus, it should be noted that the above-described embodiments are provided as examples and should not be interpreted as limiting.

What is claimed:

1. An electroluminescent display device, comprising:
a plurality of pixels; and
a common circuit connected to the plurality of pixels,
wherein each of the plurality of pixels includes:
a driving transistor including a first node, a second node, and a third node;
a capacitor connected to a fourth node and the second node, the fourth node of the pixel electrically connected to a fourth node of at least one other pixel from the plurality of pixels;
a second transistor connected to the first node and a data line;
a light emitting element electrically connected to the driving transistor; and
a bias voltage control transistor that determines whether to apply a bias voltage to the first node,
wherein the common circuit is electrically connected to the fourth node included in each of the plurality of pixels and includes:
a high-potential voltage providing circuit configured to provide a high-potential voltage to the fourth node in each of the plurality of pixels; and
a reference voltage providing circuit configured to provide a reference voltage to the fourth node in each of the plurality of pixels.

2. The electroluminescent display device of claim 1, wherein the high-potential voltage providing circuit includes a first common circuit transistor connected to the fourth node in each of the plurality of pixels and a high-potential voltage line, and wherein the reference voltage providing circuit includes a second common circuit transistor and a third common circuit transistor connected to the fourth node in each of the plurality of pixels and a reference voltage line.

3. The electroluminescent display device of claim 2, wherein the first common circuit transistor and the second common circuit transistor are controlled by a first scan signal, and the third common circuit transistor is controlled by a second scan signal, and wherein the first scan signal and the second scan signal have different pulse signals.

4. The electroluminescent display device of claim 2, wherein the second common circuit transistor includes an oxide semiconductor active layer.

5. The electroluminescent display device of claim 1, further comprising a gate driving circuit area spaced apart from the common circuit and between the plurality of pixels.

6. The electroluminescent display device of claim 5, further comprising a plurality of gate driving circuit areas, and wherein a driving circuit is configured to provide a gate signal that controls transistors included in the one pixel, and the driving circuit is in the plurality of gate driving circuit areas.

7. The electroluminescent display device of claim 6, wherein the plurality of gate driving circuit areas include an area without the driving circuit.

8. The electroluminescent display device of claim 1, wherein two data lines are in each of the plurality of pixels, and wherein each of the plurality of pixels is connected to one of the two data lines.

9. The electroluminescent display device of claim 8, wherein the plurality of pixels are in a direction of the data lines are, and wherein even-numbered pixels among the plurality of pixels are connected to one of the two data lines, and odd-numbered pixels among the plurality of pixels are connected to another of the two data lines.

10. The electroluminescent display device of claim 9, wherein the two data lines are connected to a data link line, and wherein the electroluminescent display device further comprises a multiplexer between the two data lines and the data link line.

11. The electroluminescent display device of claim 1, further comprising:
a third transistor connected to the second node and the third node, the third transistor controlled by a first scan signal.

12. The electroluminescent display device of claim 11, wherein the third transistor includes an oxide semiconductor active layer.

13. The electroluminescent display device of claim 1, further comprising:
a fourth transistor connected to the second node and an initialization voltage line, the fourth transistor including an oxide semiconductor active layer.

14. The electroluminescent display device of claim 1, wherein the driving transistor includes a polycrystalline silicon semiconductor active layer.

15. The electroluminescent display device of claim 1, wherein the plurality of pixels are divided into unit pixels, each unit pixel including a red pixel, a green pixel, and a blue pixel, and wherein the common circuit is between two unit pixels adjacent to each other and is electrically connected with pixels included in the two unit pixels.

16. A pixel driving circuit included a pixel, the pixel driving circuit comprising:
a driving transistor electrically connected with a light emitting element, the driving transistor including a first node, a second node and a third node;
a capacitor connected to a fourth node and the second node, the fourth node of the pixel electrically connected to a fourth node of at least one other pixel from a plurality of pixels;
a second transistor connected with the first node and a data line;
a bias voltage control transistor that determines whether to apply a bias voltage to the first node; and
a common circuit disposed between the plurality of pixels,
wherein the common circuit is electrically connected to the fourth node included in each of the plurality of pixels and includes:
a high-potential voltage providing circuit configured to provide a high-potential voltage to the fourth node in each of the plurality of pixels; and
a reference voltage providing circuit configured to provide a reference voltage to the fourth node in each of the plurality of pixels.

17. The pixel driving circuit of claim 16, wherein the high-potential voltage providing circuit includes a first common circuit transistor connected to the fourth node in each of the plurality of pixels and a high-potential voltage line, and wherein the reference voltage providing circuit includes a second common circuit transistor and a third common circuit transistor connected to the fourth node in each of the plurality of pixels and a reference voltage line.

18. The pixel driving circuit of claim 16, further comprising:
a third transistor connected to the second node and the third node, the third transistor controlled by a first scan signal.

19. The pixel driving circuit of claim 16, further comprising:
a fourth transistor connected to the second node and an initialization voltage line, the fourth transistor including an oxide semiconductor active layer.

* * * * *